United States Patent [19]
Wieloch et al.

[11] Patent Number: 5,641,944
[45] Date of Patent: *Jun. 24, 1997

[54] POWER SUBSTRATE WITH IMPROVED THERMAL CHARACTERISTICS

[75] Inventors: Christopher J. Wieloch, Brookfield; Thomas E. Babinski, Kenosha, both of Wis.; John C. Mather, Cedar Rapids, Iowa

[73] Assignee: Allen-Bradley Company, Inc., Milwaukee, Wis.

[*] Notice: The term of this patent shall not extend beyond the expiration date of Pat. No. 5,616,888.

[21] Appl. No.: 536,736

[22] Filed: Sep. 29, 1995

[51] Int. Cl.$^6$ .................................................. H05K 1/02
[52] U.S. Cl. ........................ 174/252; 174/254; 174/260; 361/761
[58] Field of Search ............................ 174/252, 254, 174/262, 260, 255, 261; 361/749, 761, 764, 792, 795; 439/67, 77

[56] References Cited

U.S. PATENT DOCUMENTS

| | | | |
|---|---|---|---|
| 3,760,090 | 9/1973 | Fowler | 174/52 S |
| 4,539,622 | 9/1985 | Akasaki | 361/401 |
| 4,630,172 | 12/1986 | Stenerson et al. | 361/386 |
| 4,861,272 | 8/1989 | Clark | 439/79 |
| 5,041,899 | 8/1991 | Oku et al. | 354/74 |
| 5,045,642 | 9/1991 | Ohta et al. | 174/266 |
| 5,306,874 | 4/1994 | Biron | 174/272 |

Primary Examiner—Laura Thomas
Attorney, Agent, or Firm—Joseph N. Ziebert; John M. Miller; John J. Horn

[57] ABSTRACT

A multilayer circuit board or laminated circuit board for use in a motor controller is described. The multilayer circuit board is preferably utilized as a power substrate module. The power substrate module includes a mounting area provided in a recess, window or portion of the circuit board where the circuit board is only a single layer thick. The insulated mounting area is provided in a blind via in the multilayer circuit board. The single circuit board layer at the mounting area provides a heat conductive yet highly electrically insulated mounting area for receiving a heat sink. The heat sink can be mounted on a side opposite the electrical device. The heat sink may be standard heat sink or a copper coil directly soldered to the circuit board. The multilayer circuit board includes an enhanced conductive layer for receiving the surface mount device. The enhanced conductive layer preferably includes an insulative frame which holds copper slugs. The layers are advantageously thermally matched such that heat generated during operation is evenly dissipated by the mounting area and causes uniform expansion of all layers.

20 Claims, 8 Drawing Sheets

POWER SUBSTRATE WITH IMPROVED THERMAL CHARACTERISTICS

FIELD OF THE INVENTION

The present invention relates to a multilayer circuit board including a mounting area configured to facilitate heat dissipation from an electrical device. More particularly, the present invention relates to a power substrate circuit board module, such as for use in a motor controller, having improved thermal transfer characteristics.

BACKGROUND OF THE INVENTION

In general, multilayer circuit boards are utilized in high power applications such as motor controllers, inverters, converters, power supplies, or other control devices. Typically, these boards include high-power electrical devices such as resistors and semiconductors which perform the functions required by the associated applications. As a result, these electrical devices often generate a significant amount of heat, and require heat sinks or other thermal management systems to prevent the circuit boards and electrical devices from overheating.

Heat sinks are typically metal components relatively large in size and secured to circuit boards or associated electrical devices to enhance heat dissipation therefrom. In particular, heat sinks are attached to a thermally and electrically conductive portion of an electrical device. For example, heat sinks are frequently secured directly to the lead frame of the device with hardware such as brackets, bolts, or other mountings. This additional hardware is expensive and increases the assembly time for the circuit board. The heat sinks are often electrically isolated from the lead frame with a heat conducting, electrically insulating layer of film or other material which is placed between the electrical device and the heat sink. Such a layer is disadvantageous because installing the layer increases the assembly time for the circuit board. Furthermore, the integrity of the layer is very difficult to inspect.

Some electrical devices are packaged as surface mount devices which utilize a minimum amount of space on the circuit board. However, higher power surface mount devices must be mounted on or near large pads or sections of the metal layer on the circuit board to provide adequate heat dissipation. These large sections are disadvantageous because the space required by the large sections could otherwise be utilized by other electrical components or eliminated to reduce the footprint of the board. To reduce the size of these large sections, surface mount devices are often mounted on circuit boards made from ceramic, aluminum-based substances, or other materials which have a high thermal capacity. Drawbacks with these types of circuit boards include their expense and weight.

Particular applications require circuit board systems which are optimized for superior heat dissipation. For example, in the field of electronic motor controllers, it is commonplace to build a controller package as an assemblage of circuit boards including a power substrate module or other heat dissipating medium. Each of the circuit boards supports components and conducting paths for accomplishing various functions in the completed device. Such motor controllers generally include control logic circuitry and power components. The control logic circuitry, typically including programmable solid state circuits such as a programmable logic controller mounted on a motherboard or a separate logic circuit module, monitors operating parameters of the motor and generates control signals for driving the motor in accordance with a preset control routine and various operator inputs. The power components typically include diode rectifying circuits for receiving AC power from a source and converting it to DC power, and power transistors or similar solid state switching devices, such as insulated gate bipolar transistors (IGBTs), for converting the DC power to controlled AC signals for driving the motor based upon the control signals produced by the control circuitry. The power components are mounted on the power substrate module.

In motor controllers of this type, the board, substrate, or foundation for the power substrate module is often manufactured from an expensive ceramic or aluminum-based (e.g., $Al_2O_3$) material having conductive lines and components on only a single side. This type of circuit board or substrate is expensive and increases the amount of space required for the motor controller package. In addition, due to the presence of different materials in such substrates, such as copper conductive layers, insulating layers, an aluminum-based heat dissipation layer and so on, high temperatures arising during operation of the power circuitry often lead to different amounts of thermal expansion between the various layers, resulting in considerable stress and even to failure of the substrate.

Another drawback of known power substrates arises from parasitic inductance between circuit components. Because power switching circuits are typically operated at a very high switching frequency, such inductance leads to voltage spikes, particularly in a turnoff phase of inverter operation. Such spikes are commonly reduced by the use of snubbing circuits, further adding to the cost and complexity of the substrate and supporting circuitry.

Thus, there is a need for a multilayer circuit board having an insulated mounting area for a surface mount device and a heat sink. There is also a need for a low cost multilayer circuit board optimized for heat dissipation and the reduction of parasitic inductance. There is further a need for a low cost circuit board which can be configured for use as a power substrate module in a motor controller.

SUMMARY OF THE INVENTION

The present invention relates to a novel power substrate circuit board having improved thermal transfer characteristics, including a structure that promotes uniform, matched expansion and contraction of the various board layers throughout successive thermal cycles occurring during use. The board also features improved thermal dissipation characteristics that promote more even heating of various regions of the board, as well as better transfer of heat to a heat sink coupled to the board.

Thus, in accordance with one aspect of the invention, a multilayer circuit board is provided having enhance thermal transfer characteristics. The circuit board includes a first layer, an insulating layer and a conductive layer. The first layer includes a region of heat dissipating material for supporting a power electronic component on a first side thereof, the heat dissipating region being substantially larger than the component. The insulating layer is disposed on a second side of the first layer opposite to the first side. The conductive layer is disposed on a side of the insulating layer opposite from the first layer, and includes current carrying paths for conducting electrical signals to the power electronic component. The heat dissipating material transfers heat generated during operation of the component throughout the first layer and through the insulating layer to the conductive layer.

In accordance with another aspect of the invention, a multilayer power substrate circuit board having enhanced thermal transfer characteristics includes a fist layer, an insulating layer and a mounting region. The first layer includes current carrying paths on a first side thereof for conducting power signals to an electronic power component. The insulating layer is disposed on a second side of the first layer. The mounting region is made of a thermally conductive material and directly supports and contacts the electronic power component to dissipate heat therefrom. The mounting region is substantially larger than a mounting surface of the component. The mounting region dissipates heat generated by operation of the component to the first layer through the insulating layer.

In accordance with a further aspect of the invention, a power substrate module includes first and second switching devices, a first board layer, first and second metal mounting regions, a first insulating layer and a second board layer. The first and second switching devices convert direct current power to controlled alternating current power in response to control signals. The first board layer includes current carrying paths for conducting electrical signals between the switching devices and external circuitry. The first and second metal mounting regions support the first and second switching devices, respectively, and dissipate heat generated by operation of the switching devices throughout the module. The first insulating layer is disposed below the first board layer, while the second board layer is disposed below the first insulating layer. The second board layer includes a heat dissipating region thermally coupled to the mounting regions through the first insulating layer. The first board layer, the mounting regions, the first insulating layer and the second board layer have matched coefficients of thermal expansion, whereby the layers of the circuit board expand substantially uniformly throughout thermal cycles resulting from operation of the switching devices.

BRIEF DESCRIPTION OF THE DRAWINGS

The preferred embodiments of the invention will hereinafter be described in conjunction with the appended drawings, wherein like numerals denote like elements, and.

Figure 1:
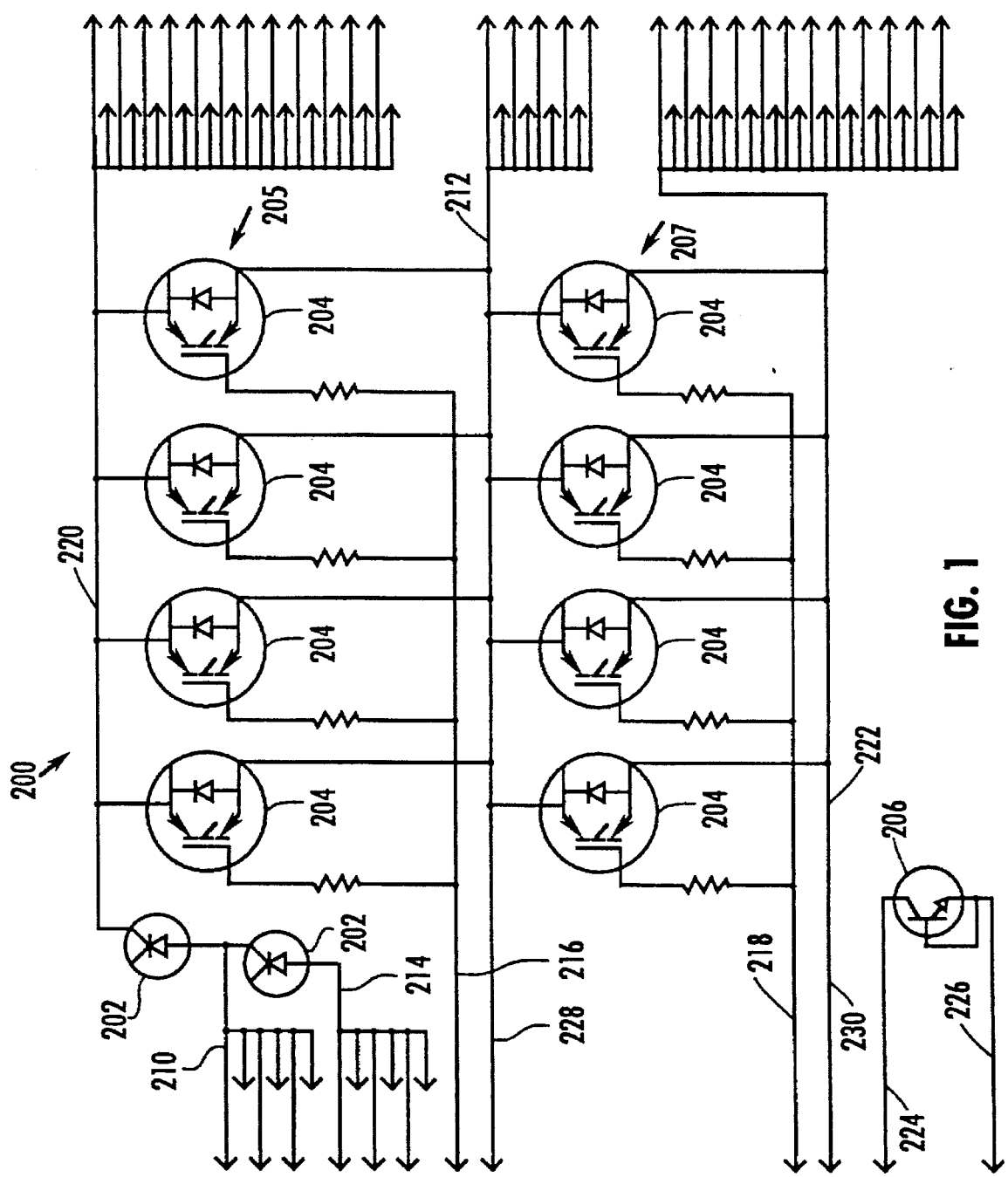
FIG. 1 is a schematic electrical diagram of the components and interconnections of a power module in accordance with an exemplary embodiment of the present invention.

DETAILED DESCRIPTION OF THE PREFERRED EXEMPLARY EMBODIMENTS OF THE PRESENT INVENTION

A motor controller system (not shown) or similar power electronic device includes power circuitry 200 for converting an alternating current (AC) power signal to a direct current (DC) power signal and then inverting the DC power signal to an AC output signal, such as by a pulse-width-modulation technique for driving an electric motor (not shown). Power circuitry 200 includes rectifiers 202, semiconductor switches 204, and a temperature sensor 206. Rectifiers 202 are preferably 40EPS12 power rectifiers, and semiconductor switches 204 are preferably IRGPH50MD2 insulated gate bi-polar transistors (IGBT's). Rectifiers 202 and semiconductor switches 204 are preferably packaged in surface mount packages 208 (FIG. 2) such as a D packs, D2 packs, D3 packs, ice packs, or other high density board mounting packages. Rectifiers 202 and switches 204 may be replaced by other power semiconductor devices such as a voltage regulator, diode bridge, operational amplifier, thyristor, SCR, or triac.

Power circuitry 200 receives the single phase alternating current (AC) power signal at a phase input bus 210 and provides the AC motor output signal to a motor (not shown) at a motor output bus 212. Power circuitry 200 also includes a phase return bus 214 associated with the AC power signal at bus 210, a first gate control bus 216, a second gate control bus 218, a positive DC power bus 220, a negative DC power bus 222, a temperature signal bus 224, and a ground bus 226. Additionally, power circuitry 200 includes a first gate return bus 228 and a second gate return bus 230. Busses 210, 212, 214, 220, and 222 preferably include numerous connector lines, finger connectors, pins, or other connection interface for conducting signals to and from power circuitry 200 (discussed in more detail with reference to FIGS. 5 and 8). A bank 205 of switches 204 is coupled between power bus 220 and motor output bus 212, and a bank 207 of switches 204 is coupled between motor output bus 212 and power bus 222.

Figure 2:
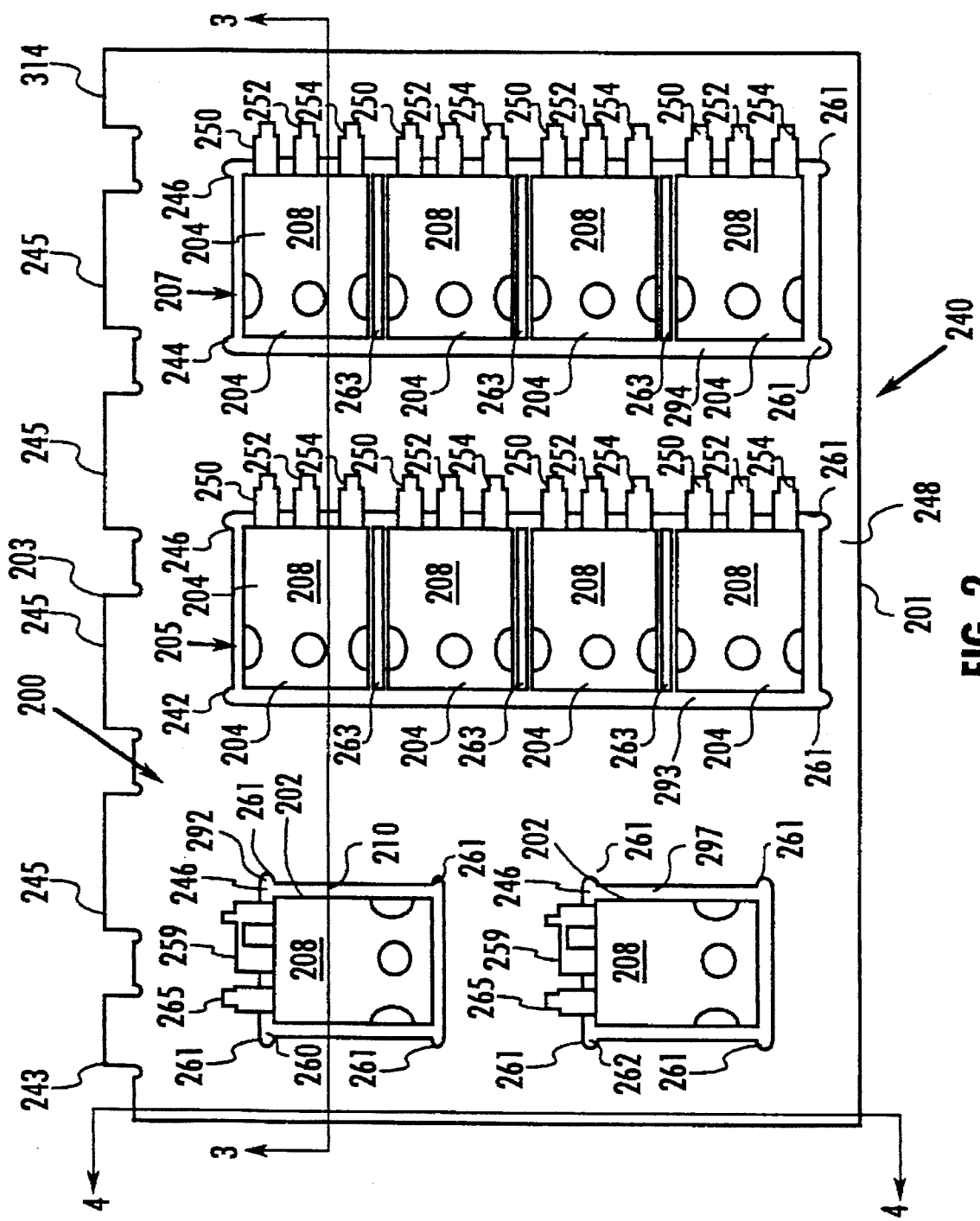
FIG. 2 is a top view of a multilayer circuit board including the components illustrated in FIG. 1 (without printed circuit board connectors) in accordance with an exemplary embodiment of the present invention.

As shown in FIG. 2, power circuitry 200 is mounted on a multilayer circuit board 201 to form a power substrate module 240. Bank 205 of switches 204 is mounted in a window or recess 242 in a multilayer circuit board 201, and bank 207 of switches 204 is mounted in a recess 244 in multilayer circuit board 201. Multilayer circuit board 201 also includes recesses 260 and 262 for holding rectifiers 202. Multilayer circuit board 201 is comprised of a mounting layer 246 (e.g., at the bottom of recesses 242, 244, 260 and 262) and at least one additional circuit board layer 248.

Rectifiers 202 and switches 204 are preferably power semiconductor devices, resistors, diodes, or other components requiring relatively high heat dissipation. Rectifiers 202 and switches 204 are preferably mounted in a plastic or ceramic package 208 or other casing and include a lead frame 209 (FIG. 3) which is electrically connected to the drain of switches 204 or electrically coupled to the cathode of rectifiers 202. Leads 254 are connected to the gate of switches 204; leads 252 are coupled to the drain of switches 204; and leads 250 are coupled to the source of switches 204. Lead frame 209 is electrically and mechanically coupled to leads 252 of switches 204 and mounting layer 246. Rectifiers 202 include an anode lead 259 and a cathode lead 265. Rectifiers 202 are packaged similar to semiconductor switches 204 and include lead frame 209 (FIG. 3) electrically and mechanically coupled to mounting layer 246 and cathode lead 265.

Module 240 includes footprints or mounting areas (not shown in FIG. 2) in a pattern configured to receive leads 250, 252, 254, 259 and 265 and lead frames 209 of rectifiers 202 and switches 204. The footprint typically includes main pads or contact areas on mounting layer 246 corresponding to lead frames 209 and pads on circuit board layer 248 corresponding to leads 250, 254 and 259. Because the necessary connections with lead frames 209 are completed through layer 248, lead 252 can be removed from switches 204 and lead 265 can be removed from rectifiers 202.

In the embodiment shown in FIG. 2, recesses 242, 244, 260 and 262 are rectangular and shaped in accordance with the shape of rectifiers 202 and switches 204. Recesses 242, 244, 260 and 262 each include four semi-circular corners 261 having a radius of 0.047 inches. Semi-circular corners 261 ease the placement and removal of switches 204 and rectifiers 202.

Recesses 242 and 244 also each include three placement members 263. Members 263 are made from layer 248 and are non-conducting elements. Members 263 are preferably 0.068 inches wide and 0.646 inches long. Recesses 242 and 244 are each 0.834 inches wide and 2.756 inches long. Recesses 242 and 244 are configured to hold four of switches 204 in the spaces between placement members 263. Recesses 260 and 262 are each 0.638 inches wide and 0.840 inches long. The dimensions and shapes of recesses 242, 244, 260 and 262 advantageously allow rectifiers 202 and switches 204 to be securely held in multilayer circuit board 201 for ease of manufacture (e.g., soldering to board 201) and yet be easily inserted and removed. Recesses 242, 244, 260 and 262 are preferably at least one circuit board layer deep (e.g., the depth of layer 248 or approximately 0.013 inches). Alternatively, recesses 242, 244, 260 and 262 can be several layers deep.

Figure 3:
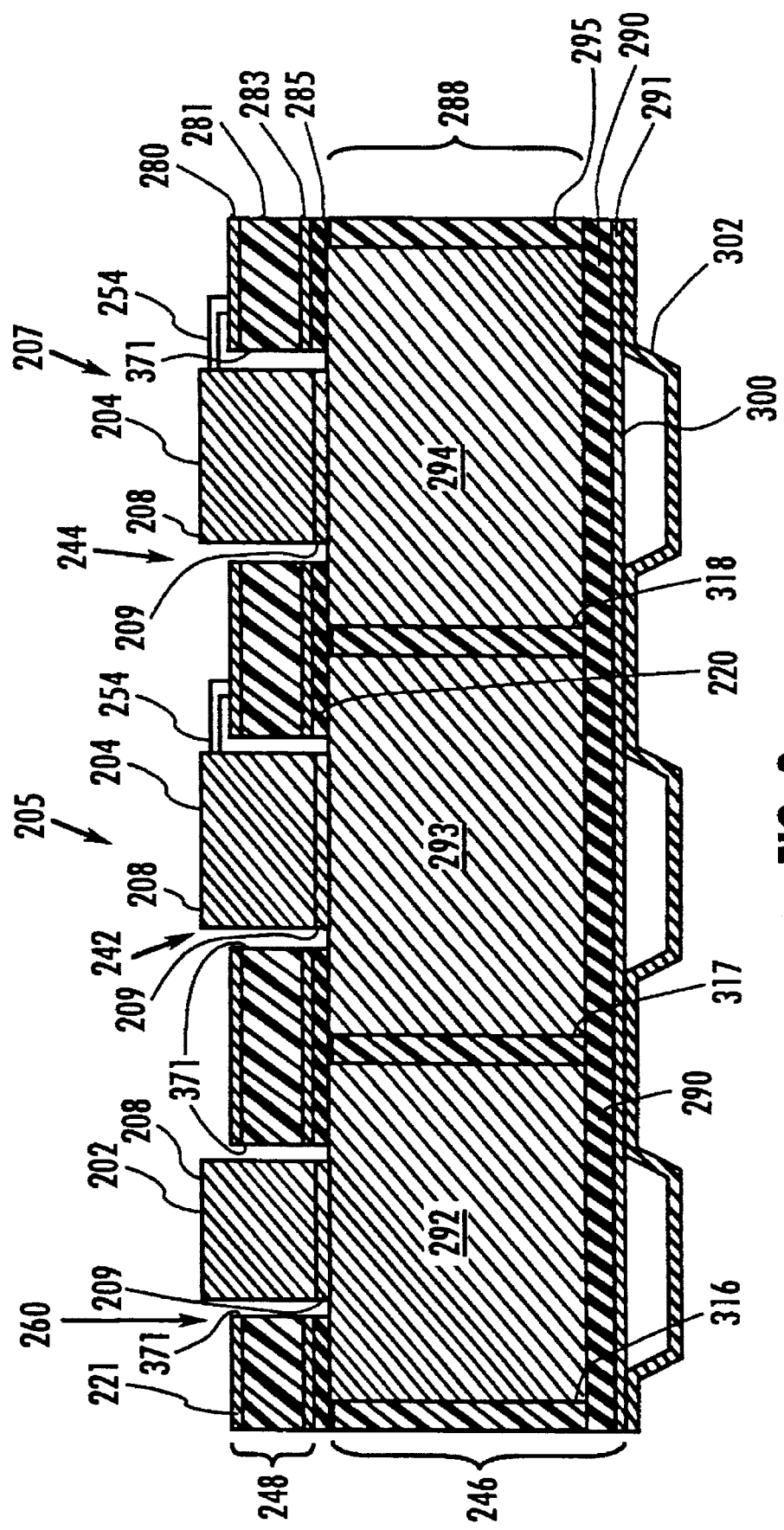
FIG. 3 is a cross sectional view of the power module illustrated in FIG. 2 along line 3—3.
Figure 4:
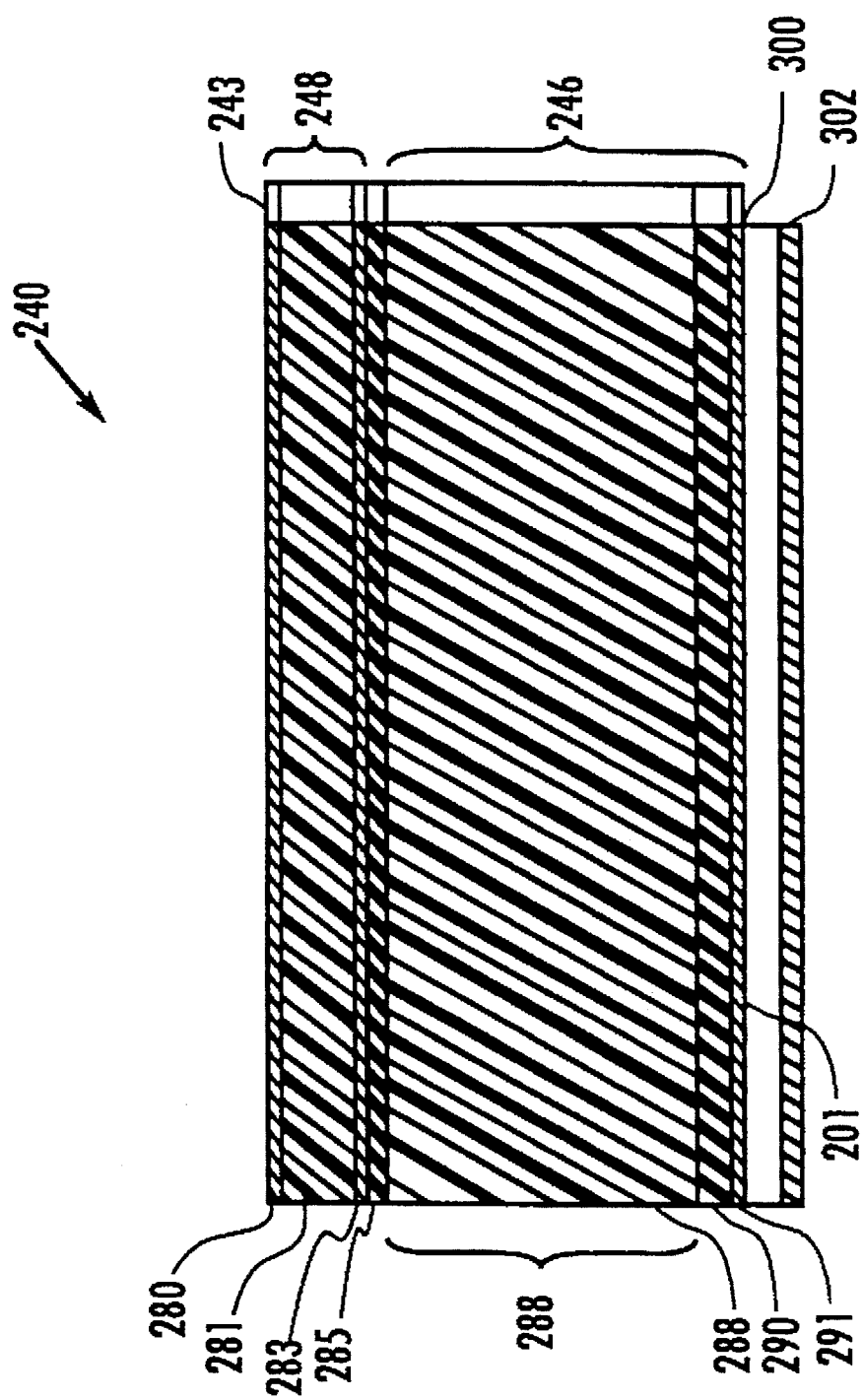
FIG. 4 is a cross sectional view of the power module illustrated in FIG. 2 along line 4—4.

With reference to FIGS. 3 and 4, board 201 of module 240 is comprised of circuit board layer 248 and mounting layer 246. Layer 248 is preferably a double sided printed circuit board layer including a conductive layer 280, an insulative layer 281, a conductive layer 283, and an insulative layer 285. Layers 280 and 283 are 1 oz. copper layers (0.0015 inch thick metal layers). Layer 281 is preferably 0.009 to 0.006 inch thick layer of glass epoxy material. Layer 285 is preferably a 0.002 inch thick layer of epoxy laminate or prepreg bond film material.

Layer 246 is an enhanced metal circuit board layer including an enhanced conductive layer 288, an insulative layer 290, and a conductive layer 291. Layer 246 is a double sided printed circuit board layer. Enhanced conductive layer 288 is comprised of conductive members or slugs 292, 293 and 294 mounted in an insulative frame 295. Enhanced metal circuit board layer 246 also includes a conductive member or slug 297, similar to slug 292, for the second rectifier 202. (FIG. 2). Insulative layer 290 is placed on enhanced conductive layer 288 as a resin, uncured adhesive, or an epoxy laminate and cured to form a rigid layer. Layer 290 is preferably two 0.002 inch layers of a prepreg bond film material.

Insulative frame 295 is a 0.032 inch thick frame having rectangular apertures 316, 317, 318, and 319 (FIG. 7) configured to support slugs 293, 294, 295 and 297, respectively. Insulative frame 295 is manufactured from a glass epoxy or other insulative material. Slugs 292, 293, 294 and 297 are preferably 0.030 inch thick rectangular copper members which are significantly larger than lead frames 209 or the footprint associated with rectifiers 202 and switches 204. The large size of slugs 292, 293, 294, and 297 enhances the thermal capabilities of board 201. Conductive layer 291 is a 1 oz. copper layer (0.00150 inch thick metal layer).

Conductive layers 280, 283 and 291 and slugs 292, 293 and 294 are preferably copper, but can be silver, conductive inks, aluminum, or other conductive materials which are etched or deposited to provide conductors such as printed circuit board conductor (not shown in FIGS. 1–4). Insulative layers 281, 285 and 290 and insulative frame 295 are preferably glass reinforced epoxy, prepreg bond film, GR4, FR4, paper mica, teflon floralpolymer, insulative resin, or other insulating materials. Insulative layer 285 is between layers 246 and 248 and prevents printed circuit conductors (not shown in FIGS. 3 and 4) from shorting with printed circuit conductors of other layers.

In the presently preferred embodiment, conductive layers 280, 283, 291 and slugs 292, 293 and 294 have the same coefficient of thermal expansion as insulating layers 281, 285 and 290, and frame 295. In particular, all conductive layers and slugs are made of copper and all insulating layers are reinforced resinous layers formulated to provide a coefficient of thermal expansion matching that of copper. Thus, as the various layers of module 240 are heated during operation, heat is dissipated by slugs 292, 293 and 294 to surrounding portions of board 201 and to a heat sink as described below. As module 240 expands and contracts in subsequent thermal cycles due to use and to environmental conditions, internal stresses are minimized by the uniform expansion of all layers of board 201.

Slugs 292, 293, 294 and 297 and insulating frame 298 cooperate to provide footprints, pads, mounting areas or contact areas for receiving lead frames 209 of rectifiers 202 and switches 204. Slug 293 is electrically coupled to bus 220 and electrically coupled to lead frame 209 of switches 204 in bank 205. Slug 294 is electrically coupled to lead frame 209 of switches 204 in bank 207 and electrically coupled to motor output bus 212. Slug 292 is coupled to phase input bus 210 and receives lead frame 209 of rectifier 202 in recess 262. Anode lead 259 of rectifier 202 in recess 260 is also coupled to bus 210. Slug 297 (FIG. 2) is coupled to bus 214 and lead frame 209 of rectifier 202 in recess 262. The electrical coupling of the various components and busses is accomplished through the use of plated surfaced and holes as will be described more fully below.

Walls 371 of recesses 242, 244, 260 and 262 are preferably plated with a conductive material such as copper. The plating of walls 371 allows layers 280 and 283 to be coupled to slugs 292, 293, 294 and 297.

A heat sink area 300 is preferably provided on layer 291 of enhanced metal circuit board layer 246 to receive a heat sink 302. Heat sink area 300 allows a heat conductive component such as heat sink 302 to be soldered directly to mounting or enhanced metal circuit board layer 246. Heat sink 302 can be a copper, aluminum, or other conductive material designed for dissipating heat. Heat sink 302 is preferably a light weight, crimped or stamped, continuous copper coil material or industry standard heat sink such as those manufactured by Thermalloy, Inc. or E&G Wakfield Engineering. Lightweight copper coil materials such as those ordinarily utilized in automotive radiator systems provide an inexpensive heat dissipating medium for module 240 which can be directly soldered to board 201.

Module 240 is preferably a solderable component module (SCM™) interconnect, SIP module, or other board which can be perpendicularly mounted in a parent or motherboard (not shown). Preferably, the motherboard has an aperture or trench configured to receive edge 203 (FIG. 2) of board 201. Board 201 includes a phase voltage mounting leg 243, DC bus mounting legs 245 and a control signal mounting leg 314. Legs 243, 245, 314, and edge 203 are shaped and arranged to ease placement and soldering of board 201 in the motherboard.

With reference to FIGS. 5–8, the printed circuit layout for conductive layers 280, 283, and 291 and enhanced conductive layer 288 of board 201 are shown in detail and constructed as described below. Layers 280, 283, and 288 and 291 are optimized to minimize lead lengths associated with circuitry 200 so inductive and capacitive effects on board 201 are minimized.

Figure 5:
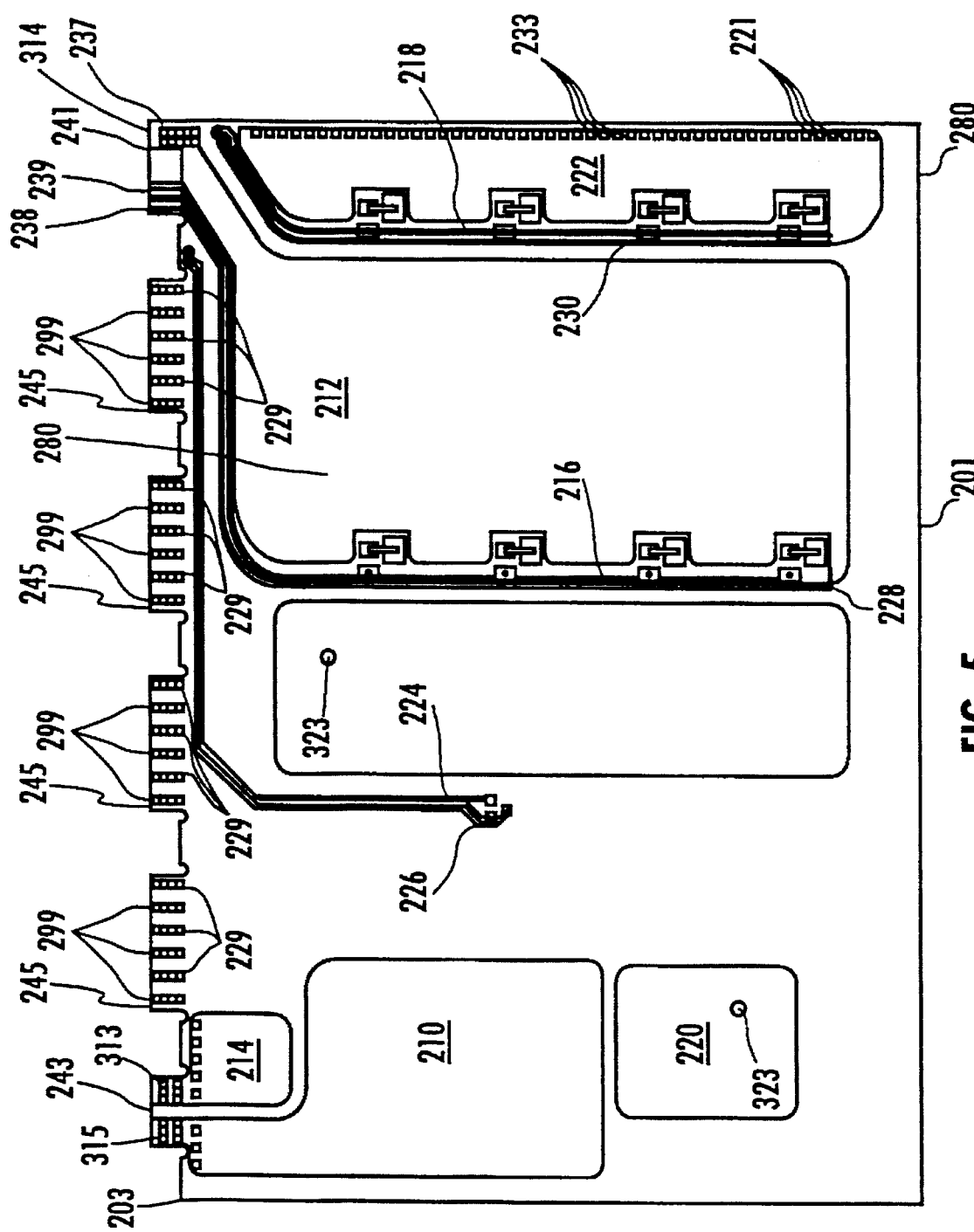
FIG. 5 is a top view of a first conductive layer in the power module illustrated in FIG. 2.

Phase voltage mounting leg 243 includes a finger connector 315 and a finger connector 313 (FIG. 5). Finger connector 315 is coupled to bus 210, and finger connector 313 is coupled to bus 214. DC mounting legs 245 preferably include power finger connectors 229 and ground finger connectors 299. Finger connectors 229 and 299 are arranged adjacent each other; six finger connectors 299 and 229 are provided on each mounting leg 245. Finger connectors 229 and 299 are coupled to buses 220 and 222, respectively. This advantageous orientation of finger connectors 229 and 299 reduces parasitic inductance associated with making connections between module 240 and the motherboard, circuit boards or other mounting interface.

Figure 8:
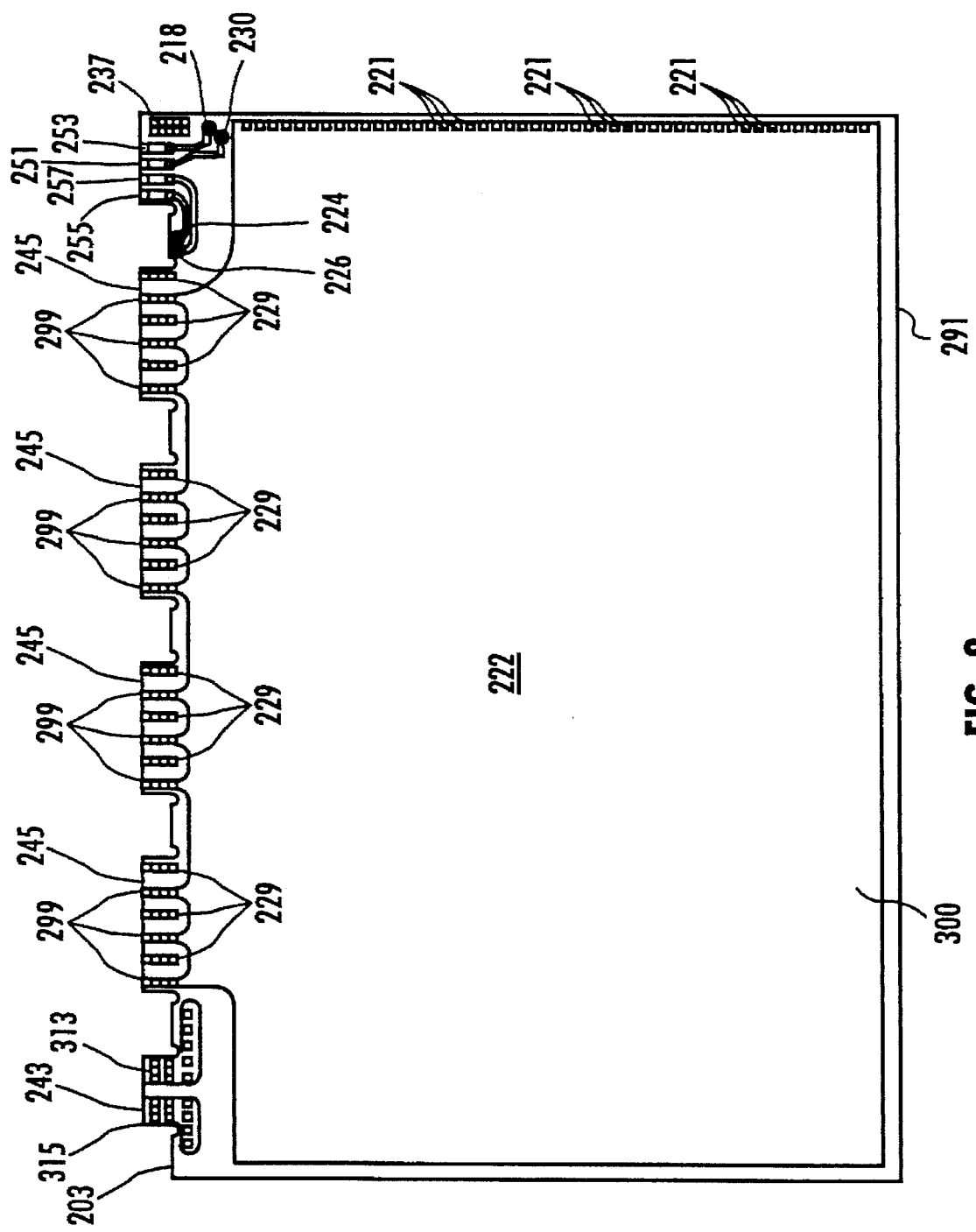
FIG. 8 is a top view of a third conductive layer for the power module illustrated in FIG. 2.

Control signal mounting leg 314 includes finger connectors 238, 239 and 241 on layer 280 and finger connectors 251, 253, 255 and 257 on layer 291 (FIG. 8). Finger connectors 239 and 241 are coupled to buses 216 and 228, respectively. Finger connectors 251 and 253 are coupled to buses 230 and 218, respectively. Finger connectors 255 and 257 are coupled to buses 224 and 226, respectively.

Finger connectors 229, 299, 255, 257, 251, 253, 238, 239, 241, 313 and 315 on mounting legs 243, 245 and 314 advantageously reduce noise, parasitic inductance, and impedance associated with the connections between module 240 and other circuit boards in the motor controller (not shown). Reducing parasitic inductive effects allows module 240 to be viewed as though it is mounted on the same circuit board as other components on the motherboard, thereby simplifying the design of the motor controller system. Additionally, reducing parasitic inductive effects allows number circuits, filters and other networks typically required in high power applications to be eliminated.

In FIG. 5, motor output bus 212 is shown etched on layer 280 so source leads 254 of switches 204 in bank 205 can be coupled to motor output bus 212. Similarly, negative DC power bus 222 on layer 280 is etched so source leads 254 of switches 204 in bank 207 can be coupled to bus 222.

Phase input bus 210 is etched on layer 280 for coupling to rectifiers 202 in recesses 260 and 262 (FIGS. 2 and 3). Bus 214 is also etched in layer 280 so anode lead 259 of rectifier 202 in recess 260 can be coupled to bus 214. Buses 210 and 214 are coupled to finger connectors 313 and 315, respectively, on mounting leg 314 of board 201. As shown in FIG. 5, recess 260 (FIG. 2) is coupled to bus 210, and recess 262 is isolated from any connectors on layer 280. Similarly, recess 242 (FIG. 2) is isolated from any connectors on layer 280. Recess 244 is coupled to bus 212. Bus 222 is coupled through holes 221 on layer 280 to reduce noise associated with circuitry 200.

Figure 6:
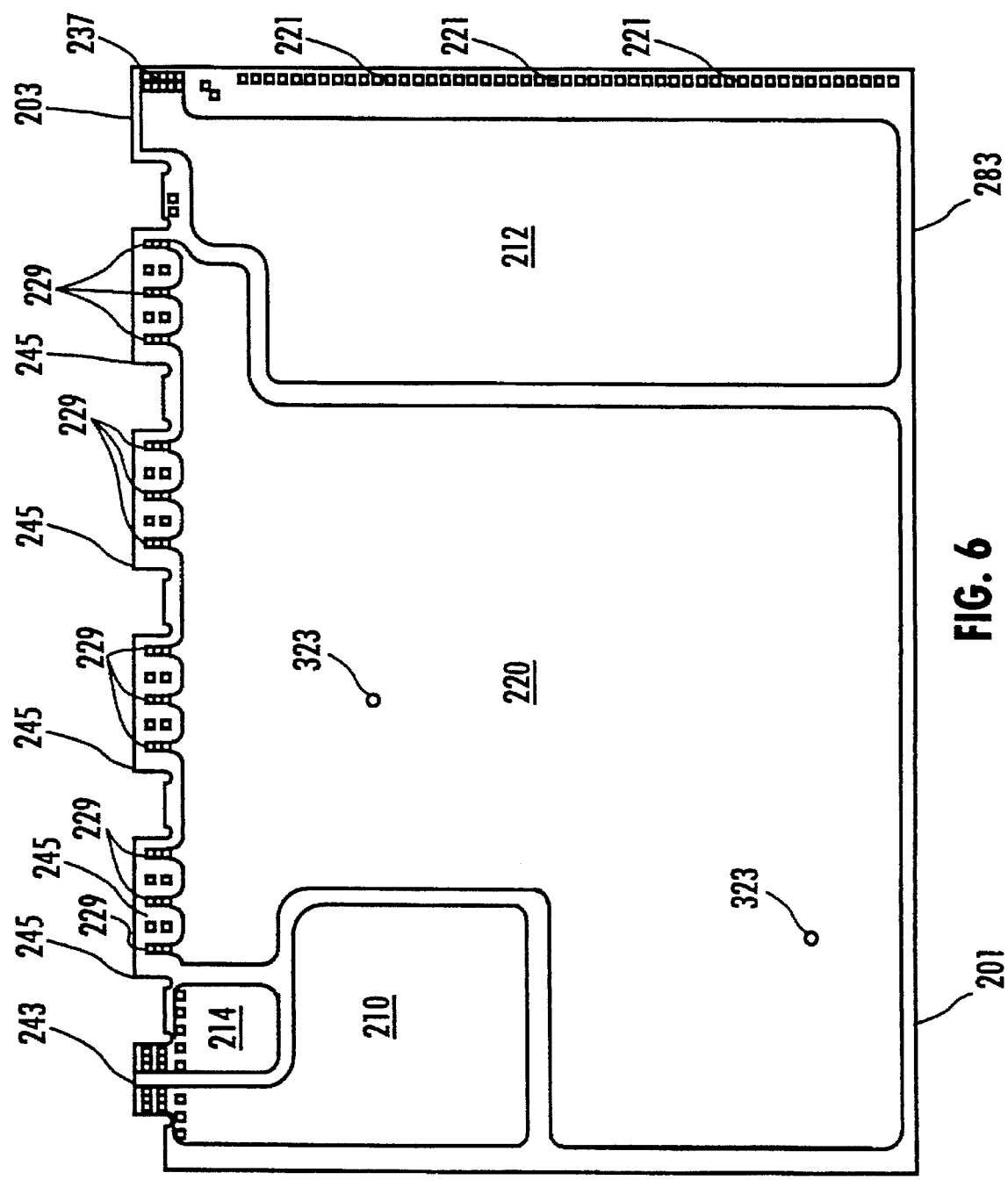
FIG. 6 is a top view of a second conductive layer on the power module illustrated in FIG. 2.
Figure 7:
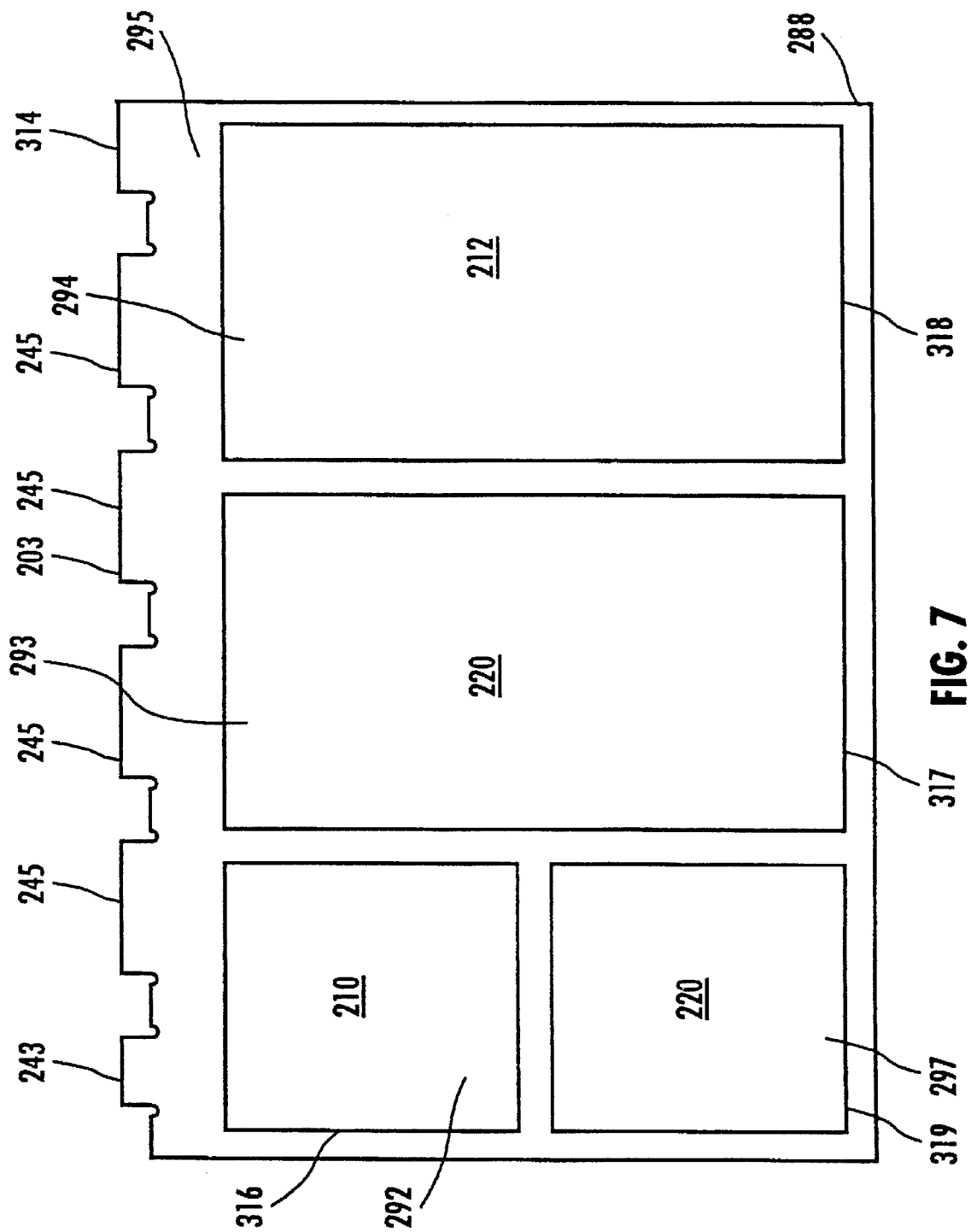
FIG. 7 is a top view of an enhanced metal circuit board layer including an insulative frame and copper slugs for the multilayer circuit board illustrated in FIG. 2.

As shown in FIG. 6, conductive layer 285 is shown etched to provide buses 210, 212, 214 and 220. Bus 220 is coupled to finger connectors 229. Bus 212 is coupled to plated holes 237 which provide connections to bus 212 on other layers, such as figure connector 314 on layer 280 (FIG. 5). Buses 214, 210, 212 and 220 on layer 283 are preferably configured to match the geometry of enhanced conductive layer 288 (FIG. 7). In this way, enhanced conductive layer 288 does not have to be etched or otherwise manipulated to form conductive lines.

Layer 283 is configured so that bus 212 corresponds to recess 244, bus 220 corresponds to recesses 242 and 262, and bus 210 corresponds to recess 260. Plated holes 323 allow connections of bus 220 to other conductive layers such as layers 280, 288 and 291.

With reference to FIG. 7, insulative frame 295 is designed so slugs 292, 293, 294 and 297 are placed in alignment with buses 210, 220, 212 and 220, respectively. Slugs 292, 293, 294 and 297 preferably fit flush within apertures 316, 317, 318 and 319, respectively, so voids are eliminated between frame 295 and slugs 292, 293, 294, and 297. Apertures 316, 317, 318 and 319 are spaced 0.159 inches apart to provide adequate isolation between slugs 292, 293, 294 and 295 and are milled in a fiber reinforced insulative layer such as FR-4 fiber reinforced epoxy circuit board to form frame 295. Alternatively, frame 295 may be formed by molding, cutting, drilling, or other configuration process. Slugs 292, 293, 294 and 297 may be advantageously formed of other shapes or sizes. Preferably, slugs 292, 293, 294 and 297 have an enhanced thickness such as 0.030 inches to assist in the dissipation of heat from switches 204 and rectifiers 202.

As shown in FIG. 8, negative DC power bus 222 including heat sink area 300 is provided on conductive layer 291. Bus 222 is coupled to finger connectors 299 on board 201 of module 240.

Finger connectors 229, 299, 313, 315, 237, 255, 251, 253 and 257 provide an advantageous coupling of the various buses between layers 280, 283, 288 and 291. Additionally, negative DC power bus 222 is coupled between conductive layers 280, 283, 288 and 291 via plated holes 221. Bus 222 is configured to cover almost all of layer 291 and provide heat sink area 300.

Finger connectors 229, 239, 241, 251, 253, 255, 257, 294, 313 and 315 are configured to be coupled to plated-through finger connectors or hemicylinders in the mounting hole, aperture, trench or slot in the motherboard (not shown). Alternatively, mounting legs 243, 245, and 314 may be adapted for use in a slot edge connector, card connector, or other printed circuit board connector.

It should be noted that the foregoing construction of module 240 creates relatively large, parallel planes of conductive material defining busses 220 and 222 (see FIGS. 6 and 8). Unlike known power substrates, wherein DC busses are tyupically defined as surface traces on a substrate material and coupled to the power components by wire bonding techniques, the arrangement of busses 220 and 222 provides a large area for cancelling or reducing parasitic inductance during switching phases of the inverter circuitry. The inventors have found that voltage spikes during turnoff phases of operation of switches 204 may thus be virtually eliminated without recourse to snubbing circuitry or the like.

It should also be noted that the preferred structure described above provides considerably enhanced thermal properties heretofore unavailable in power substrate modules. Thus, as mentioned above, the use of thermally matched layers, including slugs 292, 293, 294 and 297, affords consistent and uniform expansion of the various portions of substrate module 240 throughout successive thermal cycles. Moreover, the use of relatively massive slugs as bases for component packages 208 not only provides for electrical connection with the circuit components, but affords a large heat dissipative layer in direct contact with the components. Where such layers are shared by several components, as in the preferred design described above, the slugs provide more uniform steady state temperatures and temperature gradients across and through board 201 than were available in heretofore known power substrates. In addition, because the slugs are thermally coupled to bus 291, and thereby to heat sink 302 through a single insulating layer 290, heat generated by operation of the power circuitry is transferred more directly to the heat sink than in known designs.

The manufacture of board 201 of module 240 is discussed below with reference to FIGS. 2–8. Enhanced conductive circuit board layer 246 is formed by placing slugs 292, 293, 294 and 297 in windows or apertures 316, 318, 319 and 317 of frame 295, respectively. Slugs 292, 293, 294 and 297 can be adhered in frame 295 with epoxy, or other adhesives. An uncured prepreg bond film layer such as layer 290 is then spread on one side of enhanced conductive layer 288 to form insulative layer 290. Layer 290 is preferably two 0.002 inch thick epoxy laminate layers. Conductive layer 291 is attached to layer 290 and then can be etched to form the conductive pattern shown in FIG. 8. Enhanced conductive layer 288 advantageously does not have to be etched due to the insulative nature of frame 295.

Layer 248 can be a conventional circuit board layer which is well known in the art. Layers 280 and 283 are attached to an insulative layer 281. Layer 283 is etched to form particular conductive patterns as shown in FIG. 6. Layer 280 can also be etched to from the pattern shown in FIG. 5, including footprints and contact areas for receiving switches 204 and temperature sensor 206. After etching layer 283, layer 248 is then attached to layer 246 by placing an adhesive insulative layer 285 between layers 248 and 246. Layers 246 and 248 are then heat and pressure cured so layers 246 and 248 are attached and layer 290 is cured.

After attachment of layers 246 and 248, multilayer circuit board 201 is adapted to form windows or recesses 260, 262, 242 and 244. Recesses 242, 244, 260 and 262 are preferably milled by a depth controlled mill. A depth control mill may be utilized to form windows without requiring a high tolerance machine because the thickness of slugs 292, 293, 294 and 297 in enhanced conductive layer 288 is sufficient (approximately 0.030 inches) to permit a tool, such as a mill cutter, to be lowered through layer 248 to form windows 260, 262, 242 and 244 without piercing the slugs. After configuring, cutting, milling, or otherwise forming recesses 242, 244, 260 and 262 in multilayer circuit board 201, holes, such as holes associated with finger connectors 313, 315, 229, 299, 241, 239, 237, 233, 327, and 323 and holes 221 and 323 are drilled in board 201. After drilling, a solder mask layer is applied to layers 288 and 291, and board 201 is further etched and plated. In particular, layer 291 is etched to form the pattern shown in FIG. 8. Further plating of circuit board 201 allows walls 371 (FIG. 3) of recesses 260, 262, 242 and 244 to be plated with conductive material. Plating walls 371 allows connection of the mounting area or slugs 292, 293, and 297 to layers 280 and 283.

Alternatively, recesses 242, 244, 260, and 262 may be formed in layer 248 before attaching layers 246 and 248. Further, recesses 242, 244, 260, and 262 may be formed by drilling, cutting, molding, or otherwise configuring circuit board layer 248. For example, recesses 260, 262, 242 and 244 can be formed by providing mounting areas close to one end of board 201. Circuit board layer 248 may be a size smaller than layer 246 and shifted to one end so only enhanced conductive layer 246 is provided on the opposite end of board 201. Also, layer 248 may be comprised of unitary pieces which are configured on top of layer 246 to form recesses 242, 244, 260 and 262.

It is understood that, while the detailed drawings, specific examples and particular materials given describe preferred exemplary embodiments of the present invention, they are for the purpose of illustration only. The method and apparatus of the invention is now limited to the precise details and conditions disclosed. For example, although particular service mount packages, electrical devices, and circuit board layers are described, the multilayer circuit board may be populated with other types of heat producing components or comprised of different materials. Also, various configurations for a heat sink conducting area may be utilized. Further still, various shapes, sizes, and materials for the copper slugs may be utilized. Moreover, while the particular power substrate module described above provides rectifying and inverting circuitry for a single phase, modules employing the same contruction may be built for three phase rectification and invertion on a single board. Similarly, although the structure described above employs four switching circuits in parallel to accomplish the desired inverting fuction, modules in accordance with the invention may be built with more or fewer switching devices in parallel, or a single pair of switches per phase. Various changes can be made to the details disclosed without departing from the spirit of the invention which is defined by the following claims.

What is claimed is:

1. A multilayer circuit board having enhanced thermal transfer characteristics, comprising:

a first layer including a region of heat dissipating material for supporting a power electronic component on a first side thereof, the heat dissipating region being substantially larger than the component;

an insulating layer disposed on a second side of the first layer opposite to the first side; and a conductive layer disposed on a side of the insulating layer opposite from the first layer, the conductive layer including current carrying paths for conducting electrical signals to the power electronic component;

the heat dissipating material transferring heat generated during operation of the component throughout the first layer and through the insulating layer to the conductive layer, the heat dissipating medium being a thick solid conductive material from the first side of the first layer to the second side of the first layer.

2. The circuit board of claim 1, wherein the region of heat dissipating material is made of an electrically conductive material and is electrically coupled to the electronic component, the dissipating material being at least 0.030 inches thick.

3. The circuit board of claim 1, further comprising at least one additional insulating layer disposed on the first side of the first layer, and an additional conducting layer disposed on a side of the at least one additional insulating layer opposite from the first layer.

4. A multilayer circuit board having enhanced thermal transfer characteristics, comprising:

a first layer including a region of heat dissipating material for supporting a power electronic component on a first side thereof, the heat dissipating region being substantially larger than the component;

an insulating layer disposed on a second side of the first layer opposite to the first side; and a conductive layer disposed on a side of the insulating layer opposite from the first layer, the conductive layer including current carrying paths for conducting electrical signals to the power electronic component;

the heat dissipating material transferring heat generated during operation of the component throughout the first layer and through the insulating layer to the conductive layer wherein a plurality of heat dissipating regions are provided in the first layer, at least one heat dissipating region being electrically isolated from other heat dissipating regions in the first layer.

5. The circuit board of claim 1, further comprising a heat sink thermally coupled to the conductive layer.

6. The circuit board of claim 1, wherein the heat dissipating region is made of an electrically conductive metal and the conductive layer includes at least one current carrying path made of the same conductive metal as the heat dissipating region.

7. The circuit board of claim 6, wherein the heat dissipating region is at least 10 times as thick as the metal forming the current carrying path on the conductive layer.

8. A multilayer power substrate circuit board having enhanced thermal transfer characteristics, comprising:
   a first layer including current carrying paths on a first side thereof for conducting power signals to an electronic power component;
   an insulating layer disposed on a second side of the first layer; and
   a mounting region made of a thermally conductive material, the mounting region directly supporting and contacting the electronic power component to dissipate heat therefrom, the mounting region being substantially larger than a mounting surface of the component, the mounting region dissipating heat generated by operation of the component to the first layer through the insulating layer, the thermally conductive material being a thick conductive layer and a solid conductive material throughout.

9. The power substrate circuit board of claim 8, wherein the mounting region supports a plurality of electronic power components and heat generated by operation of the power components is dissipated throughout the mounting region.

10. The power substrate circuit board of claim 8, wherein the mounting region is electrically coupled to the electronic power component.

11. A multilayer power substrate circuit board having enhanced thermal transfer characteristics, comprising:
   a first layer including current carrying paths on a first side thereof for conducting power signals to an electronic power component;
   an insulating layer disposed on a second side of the first layer; and
   a mounting region made of a thermally conductive material, the mounting region directly supporting and contacting the electronic power component to dissipate heat therefrom, the mounting region being substantially larger than a mounting surface of the component, the mounting region dissipating heat generated by operation of the component to the first layer through the insulating layer wherein the power substrate circuit board includes a plurality of mounting regions, each mounting region supporting and contacting at least one electronic power component, the mounting regions dissipating heat from the electronic power components to other regions of the circuit board.

12. The power substrate circuit board of claim 11, wherein the mounting regions are metal slugs disposed in a heat dissipating layer of the circuit board and isolated from one another in the heat dissipating layer by an electrically insulating framework.

13. The power substrate circuit board of claim 8, wherein the current carrying paths are made of an electrically conductive metal and the mounting region is made of the same conductive metal.

14. The power substrate circuit board of claim 8, further comprising an additional insulating layer disposed on a side of the mounting region opposite from the first layer, and an additional conducting layer disposed on a side of the additional insulating layer opposite from the mounting region, the mounting region being thermally coupled to the additional conducting layer through the additional insulating layer.

15. The power substrate circuit board of claim 14, further comprising a heat sink thermally coupled to the additional conducting layer.

16. A power substrate module, comprising:
   first and second switching devices for converting direct current power to controlled alternating current power in response to control signals;
   a first board layer including current carrying paths for conducting electrical signals between the switching devices and external circuitry;
   first and second metal mounting regions for supporting the first and second switching devices, respectively, the mounting regions dissipating heat generated by operation of the switching devices throughout the module;
   a first insulating layer disposed below the first board layer; and
   a second board layer disposed below the first insulating layer, the second board layer including a heat dissipating region thermally coupled to the mounting regions through the first insulating layer;
   the first board layer, the mounting regions, the first insulating layer and the second board layer having matched coefficients of thermal expansion, whereby the layers of the circuit board expand substantially uniformly throughout thermal cycles resulting from operation of the switching devices.

17. The power substrate module of claim 16, wherein the mounting regions are disposed in a heat dissipating layer intermediate the first board layer and the first insulating layer, and separated from the current carrying paths by a second insulating layer.

18. The power substrate module of claim 16, wherein the mounting regions are separated from one another by an insulating framework.

19. The power substrate module of claim 16, wherein the mounting regions are electrically coupled to the switching devices.

20. The power subtrate module of claim 16, wherein at least one of the mounting regions supports and is coupled to a plurality of switching devices electrically coupled in parallel.

* * * * *